United States Patent [19]
Klank et al.

[11] 3,949,307
[45] Apr. 6, 1976

[54] CIRCUIT ARRANGEMENT FOR DIGITAL FREQUENCY INDICATION IN A RADIO RECEIVER

[75] Inventors: Otto Klank, Arpke; Dieter Rottmann, Misburg, both of Germany

[73] Assignee: Licentia Patent-Verwaltungs-G.m.b.H., Frankfurt am Main, Germany

[22] Filed: Nov. 21, 1974

[21] Appl. No.: 526,052

[30] Foreign Application Priority Data
Nov. 24, 1973 Germany............................ 2358673

[52] U.S. Cl................................. 325/455; 325/317
[51] Int. Cl.².......................................... H04B 1/06
[58] Field of Search.................... 325/455, 315–317; 331/64, 49

[56] References Cited
UNITED STATES PATENTS

| 3,417,341 | 12/1968 | Elias | 325/317 |
|---|---|---|---|
| 3,509,484 | 4/1970 | Basse | 325/455 |
| 3,702,968 | 11/1972 | Sawairi et al. | 325/315 |
| 3,753,119 | 8/1973 | Close | 325/455 |

Primary Examiner—Albert J. Mayer
Attorney, Agent, or Firm—Spencer & Kaye

[57] ABSTRACT

In a circuit arrangement for digitally indicating the tuned frequency of a radio receiver operating in the AM and FM ranges in which the oscillations of the AM tuning oscillator and of the FM tuning oscillator are amplified, converted to rectangular oscillations, counted by means of electronic counters and then digitally displayed, the oscillations of the AM tuning oscillator and the oscillations of the FM tuning oscillator are amplified by a common broadband amplifier which is sufficiently broadbanded so that the oscillator frequencies for the AM range as well as those for the FM range are both passed and amplified and the coupling of the input of the broadband amplifier to the outputs of the tuning oscillators is so loose that the tuning oscillators are not noticeably detuned by changes in capacity in the broadband amplifier.

10 Claims, 7 Drawing Figures

SWITCHING FROM AM TO FM

CIRCUIT ARRANGEMENT FOR DIGITAL FREQUENCY INDICATION IN A RADIO RECEIVER

BACKGROUND OF THE INVENTION

The present invention relates to a circuit arrangement for digital indication of the received frequency in a radio receiver operating in the AM and FM ranges, wherein the oscillations of the AM and FM oscillators are amplified, converted to rectangular oscillations and counted by means of electronic counters.

It is known that in radio receivers the indication of frequency of the transmitting station is effected by a pointer which is driven by the tuning member, in most cases a variable capacitor, via a rope pulley or other similar mechanical devices. The accuracy of this indication, aside from that in commerical receivers, is unsatisfactory, however. With this type of system, the error amounts to a few kHz in the medium wave range and several 10 kHz in the short wave range even though a separation for the various ranges is provided, so that accurate setting of the desired station according to the provided scale is difficult.

It is known to overcome these drawbacks by providing a digital frequency indication(see for example, *Funk-Technik* 1971, Issue No. 5, pages 157–159 and *Radio Mentor*, 1973, Issue No. 9, pages 389–391).

The principle of digital frequency indication consists in that the number of oscillations of the AM or FM oscillator are counted by means of an electronic counter and are optically reproduced after subtracting the intermediate frequency. The counting process takes place periodically during a fixed period of time. For example, the oscillations are counted every 20 ms for a period of 10 ms.

The signals obtained from the FM or AM oscillator are too weak to actuate counting circuits. For this reason, in the known digital frequency indication arrangements each oscillator, i.e., the AM oscillator and the FM oscillator, has associated to it a broadband amplifier which amplifies the oscillations of the respective oscillator. The amplified oscillations are then converted to rectangular oscillations of the same fundamental frequency which are then suited to actuate the counting circuits.

SUMMARY OF THE INVENTION

It is the object of the present invention to simplify the known circuit arrangements for digitally indicating the tuning frequency of a radio receiver.

The present invention is based on the known circuit arrangement described above and provides a modification thereof wherein amplification of the oscillations of the AM tuning oscillator and of the oscillations of the FM tuning oscillator is carried out by means of a common broadband amplifier which is so broadbanded that the oscillator frequencies for the AM range as well as those for the FM range can be handled and the coupling of the common broadband amplifier to the AM and FM tuning oscillators is so loose that the tuning oscillators will not noticeably be detuned by changes in the capacity of the broadband amplifier. As in the prior art circuit arrangement the output of the broadband amplifier is fed to the electronic counting circuitry and finally to the indicator.

DETAILED DESCRIPTION OF THE PREFERRED EMBODIMENTS

Figure 1:
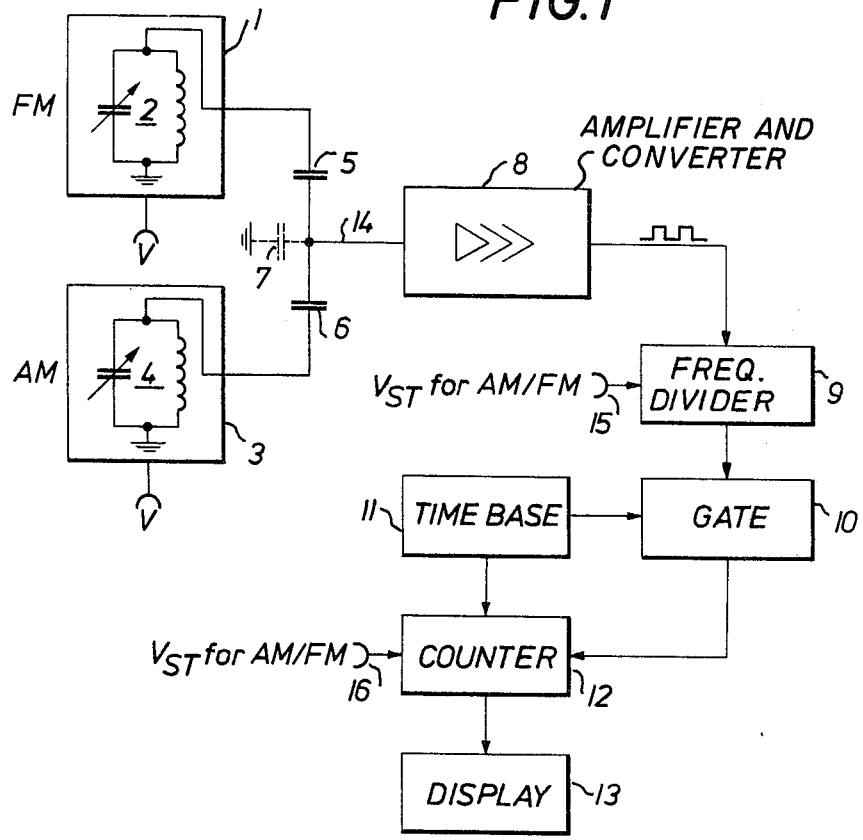
FIG. 1 is a block circuit diagram of one embodiment of a circuit arrangement according to the invention.

Referring now to FIG. 1 there are shown the FM tuning oscillator 1 and the AM tuning oscillator 3 of a radio receiver which itself is not shown. Depending on the frequency of the range received wave, only the FM oscillator 1 or only the AM oscillator 3 is in operation in that only the tuning oscillator which is presently required receives a supply voltage V. Coupled to the outputs of the oscillators 1 and 3 via respective series capacitors 5 and 6 is a broadband amplifier 8. During tuning the AM oscillator 3 sweeps a frequency range from about 0.5 to 25 MHz, while the frequency range, during tuning of the FM oscillator 1 extends from about 100 to about 120 MHz. The broadband amplifier 8, which is common for both oscillators 1, 3, must therefore have a bandwidth from 0.5 to 120 MHz so that it can amplify signals from both of the oscillators. In order to keep the load on the oscillators 1, 3 low and to realize sufficient coupling, the gain for the broadband amplifier 8 is selected to be high, for example a 1000-fold amplification.

The broadband amplifier 8 amplifies the oscillations from the respective oscillators 1 or 3 and simultaneously converts these oscillations into the rectangular oscillations required for the subsequent digital circuits which includes a frequency divider 9, a gate 10, a time base circuit 11, a counter 12 and a display divider 13. The input signal for the divider 9, must have, for example, a minimum level of 2.4V for a logic 1 and must not exceed a maximum level of 0.4V for a logic 0. Thus there results a minimum requirement for the signal voltage supplied to the divider 9 which consists of a direct portion of 1.4V and a superposed alternating portion of 2V peak to peak. It must also be considered that in order to obtain steep switching edges the alternating component must have already been through a limiter stage. An edge steepness for the rectangular oscillation which is sufficient for actuating the subsequent divider (flip-flop) at high frequencies, e.g. 100 MHz, can be obtained by fully driving or overdriving the amplifier 8, while at low frequencies, for example 500 kHz, the same edge steepness requires a correspondingly higher degree of overdriving. This corresponds on the one hand to the decrease in amplification toward the upper frequency limit and, on the other hand, it can be considered in the dimensions for the coupling circuit in that the coupling for the UHF range is selected to be somewhat looser.

The frequency divider 9 may include a plurality of flip-flop in integrated transistor-transistor logic (TTL).

With a negative edge of the input pulse the output state of a flip-flop changes from logic 0 to 1 or vice versa. Thus the sequence of the input clock pulse and thus also the frequency are divided in half, i.e., by 2. With a series connection of a plurality of flip-flops it is possible to obtain 1/4, 1/8 or 1/16 etc. of the input frequency. With suitable connections, well known to those skilled in the art, four flip-flops can provide a decimal divider.

The frequency divider 9 receives a control voltage $V_{ST}$, in order to be able to divide the input frequency to different degrees depending on the type of wave range that is being received. This is necessary with the use of the present invention because only one amplifier output is available while in the known circuit arrangements with separate broadband amplifiers either different frequency dividers are used which are then switched or the amplifier outputs must be switched to the desired frequency divider. While in the known circuit arrangements with separate broadband amplifiers one frequency divider is required per amplifier, with the use of the present invention only a single divider 9 is required since only one broadband amplifier 8 is provided.

The gate 10 connected to the output of the divider 9 periodically permits, only during a certain period of time, the pulses present at the output of divider 9 to pass. The pulses passed by gate 10 are counted by counter 12. Since it is not the oscillator frequency, but the received frequency which is of interest, a correction is effected by the amount of the intermediate frequency in question. The result is converted into direct current signals and fed to indicator 13 for optical display. The time base 11 furnishes timing signals to the gate 10 to control the time period when pulses may pass and to counter 12 which enable it for a new count and which take care that the last result remains on display until the next result is available.

As mentioned above, in order to couple the outputs of FM tuning oscillator 1 and AM tuning oscillator 3 to the common input of the broadband amplifier 8, capacitors 5 and 6, each of which has one terminal connected to the respective oscillator and other terminal connected to a common point, are provided. The common point is connected to the input of the amplifier via common coaxial line 14. This line 14 has a capacitance 7 with respect to ground which is shown in dashed lines and which can be supplemented by the addition of a fixed capacitance so that the coupling takes place via the capacitive voltage dividers 5, 7 or 6, 7, respectively. The coupling of the common broadband amplifier 8 to the two oscillators 1, 3 is loose enough that oscillators 1, 3 will not be noticeably detuned by changes in capacitance of the broadband amplifier 8.

The oscillator voltages of the oscillators 1, 3 are about IV for AM and FM. The voltage value which can be coupled out by oscillator circuits 2, 4 is limited by the value of the capacitors 5 or 6, respectively, as well as by the capacitance 7 of line 14 between the oscillator 1, 3 and the common input of the broadband amplifier 8. The capacitance values of capacitors 5 and 6 must be kept low in order to keep detuning the oscillator circuits 2, 4 and the resulting restriction of the respective receiving range to a minimum, while the capacitance 7 of line 14 cannot be reduced below a minimum value which depends on the length of the line. The capacitance values preferably selected for capacitors 5 and 6 are, for example, 1pF, and 2pF respectively. Between capacitors 5 and 7, as well as between the oscillator voltage and the broadband amplifier 8 there exists the relationship that the ratio of capacitor 7 to capacitor 5 is equal to the ratio of the oscillator voltage to the input voltage (input resistance neglected) of the amplifier 8. With a given input voltage of, for example, 30 mV, the capacitance 7 can be calculated for example to be 30 pF. The realization of such a low line capacitance for line 14 is possible by a short, highohmic cable between oscillators 1, 3 and the broadband amplifier 8 within the radio receiver. The value for the input voltage of the broadband amplifier 88 during operation of the AM oscillator 3 is then about 120 mV.

Figure 2:
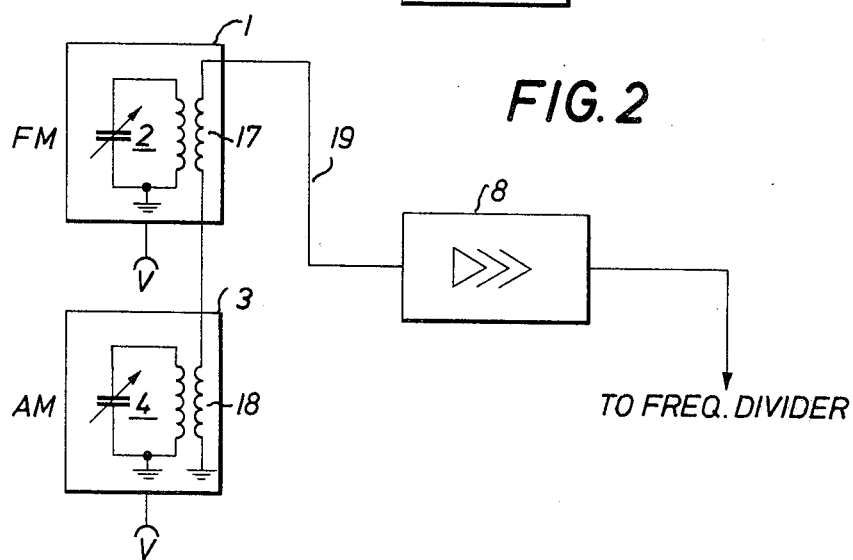
FIG. 2 shows a modification of the oscillator-amplifier coupling arrangement of the embodiment of FIG. 1.

While in FIG. 1 the coupling is high-ohmic and FM tuning oscillator 1 and AM tuning oscillator 3 are in parallel with respect to the coupling, the embodiment of FIG. 2 has a low-ohmic, inductive coupling. According to FIG. 2 the oscillations of oscillator 1 or 3, are inductively coupled to the inductances 17 or 18, respectively, which are connected in series with one end of the series connection being connected to ground and its other end connected to a line 19. The oscillations thus, via line 19, reach the common broadband amplifier 8 which is followed, as in FIG. 1, by frequency divider 9, gate 10, etc. In the case of the low-ohmic inductive coupling of FIG. 2 the line 19 can be relatively long (e.g. 50 cm). This is an advantage if for structural reasons the broadband amplifier 8 cannot be placed in the immediate vicinity of the tuning oscillators 1 and 3. Mixed couplings of coupling coils and capacitors are also possible.

Figures 3, 4, 5:
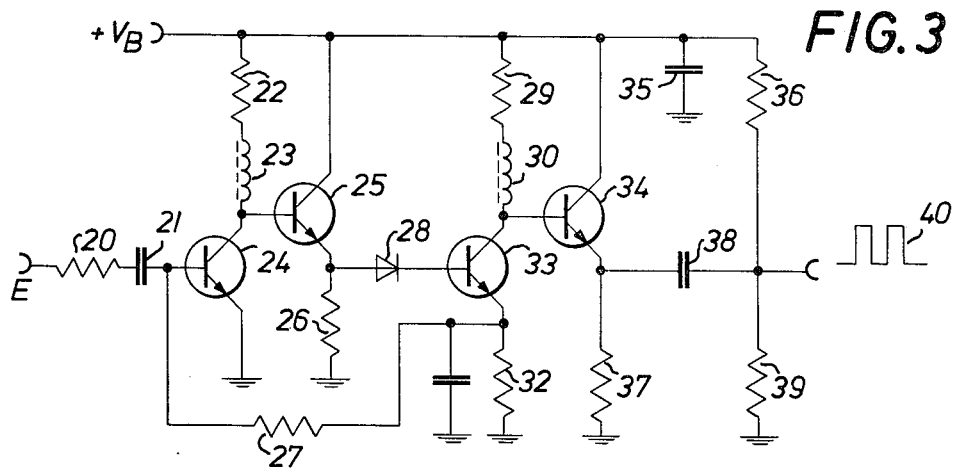
FIGS. 3 and 4 each show a circuit diagram for a broadband amplifier according to the invention.
FIG. 5 is a block circuit diagram of one embodiment of the divider of FIG. 1 for producing the various dividing ratios.

FIGS. 3 and 4 show two embodiments of the common broadband amplifier 8. The oscillations of the AM or FM oscillator are fed in FIG. 3 from the input E via resistor 20 and capacitor 21 to the base of a transistor 24. The collector of this transistor 24 is connected, via an inductance 23 and a resistor 22, with the operating voltage $+V_B$, while the emitter of transistor 24 is connected to ground. The inductance 23 counteracts a drop in the amplification at high frequencies. From the collector of transistor 24 a connection leads to the base of a further transistor 25 whose collector is connected directly with the operating voltage $+V_B$ and whose emitter is connected to ground via a resistor 26. This transistor 25 operates as an impedance converter and assures a low-ohmic coupling to the following amplifier stage formed by transistor 33. In order to bridge the direct voltage difference and to effect the coupling, the emitter of transistor 25 is connected, via one or a plurality of diodes 28, with the base of transistor 33. At the base of transistor 33 only a very low direct voltage is desired, the emitter of this transistor also having a slight voltage with respect to ground, in order to be able to fully control the subsequent transistor 34. The inductance 30 which is connected in series with resistor 29 in the collector line of transistor 33 is again provided to prevent a drop in the amplification at high frequencies.

The emitter of transistor 33 is connected to ground via a resistor 32 which is connected in parallel with a capacitor 31 to provide alternating current bridging. Moreover, the emitter of transistor 33 is connected with the base of transistor 24, via resistor 27, in order to provide a current stabilizing feedback. Finally, a further impedance converter, formed by transistor 34 is connected in series with transistor 33. The collector of transistor 34 is connected directly to the operating voltage $+V_B$, while its emitter is connected to ground, via a resistor 37. The amplified oscillations which are coupled out at the emitter of transistor 34 via a capacitor 38, have superimposed on them a direct current component by means of a voltage divider, formed by resistors 36 and 39 which is directly connected across the voltage supply terminals. Additionally a capacitor 35 is provided to filter the operating voltage +$V_B$, which is an advantageous manner simultaneously serves as the operating voltage for the subsequently connected digital circuits.

The stages of the broadband amplifiers shown in FIGS. 3 and 4 are dimensioned so that in addition to amplifying the oscillator oscillations they also convert these oscillations into the required rectangular oscillations 40 at the output of the broadband amplifier in that, beginning with the second stage of the amplifier 8 (transistor 25 or transistor 46, respectively), overdriving of the stage takes place.

The four-stage broadband amplifier (transistors 43, 46, 52, 55) according to FIG. 4 has, in contradistinction to the embodiment of FIG. 3, an RC coupling formed of capacitor 48 and resistor 50 between the emitter transistors 46 and the base of transistor 52. Moreover, two current-stabilizing feedback networks are provided. One of these networks is the T member formed of resistors 47 and 61 and capacitor 62 which is connected between the emitter of transistor 46 and the base of transistor 43, and the other of these networks is the resistor 51 connected between the emitter of transistor 55 to the base of transistor 52. The inductance 57 connected in series with the emitter resistor 56 compensates the capacitance of the output load (the subsequent digital circuits) and serves to decouple the emitter resistor 56 which in this amplifier embodiment is required to dimension the direct current.

The values of the components of an example of each of the two embodiments of the broadband amplifier which have been proven in practice are as follows:

FIGURE 3:
| | |
|---|---|
| Supply Voltage +$V_B$ | = 5V |
| Transistors 24, 25, 33 | = BF 240 |
| Transistor 34 | = BF 523 |
| Resistor 20 | = 100 Ω |
| Resistors 22, 29, 37, 39 | = 330 Ω |
| Resistor 26 | = 470 Ω |
| Resistor 27 | = 1 kΩ |
| Resistor 32 | = 120 Ω |
| Resistor 36 | = 1.5 kΩ |
| Capacitor 21 | = 20 nF |
| Capacitors 31, 35 | = 0.1 μF |
| Capacitor 38 | = 50 nF |
| Inductances 23, 30 | = 1 μH |

FIGURE 4:
| | |
|---|---|
| Supply Voltage +$V_B$ | = 5V |
| Transistors 43, 46, 52 | = BF 241 |
| Transistor 55 | = BF 523 |
| Resistors 42, 51 | = 4.7 kΩ |
| Resistors 44, 53 | = 330 Ω |
| Resistor 47 | = 4.7 kΩ |
| Resistor 49 | = 470 Ω |
| Resistor 50 | = 2.2 kΩ |
| Resistor 56 | = 180 Ω |
| Resistor 59 | = 560 Ω |
| Resistor 61 | = 4.7 kΩ |
| Capacitors 41, 48 | = 50 nF |
| Capacitor 60 | = 0.1 μF |
| Capacitor 62 | = 50 nF |
| Inductances 45, 54 | = 0.25 μH |
| Inductance 57 | = 1 μH |

Referring now to FIG. 5 there is shown a block diagram of the frequency divider 9 to illustrate how the various dividing ratios can be obtained in the frequency divider 9 during either AM and FM operation, although for both modes of operation only a single broadband amplifier 8 is used. According to the preferred illustrated embodiment, the frequency divider includes three dividers 63, 64 and 66 and a switch 65, with the divider 64 being connected to the output of divider 63 and the switch 65 serving to connect the input of divider 66 either to the output of divider 64 or to the output of divider 63 via path 67. Preferably the first divider 63 of this series connection, i.e., the one immediately following the broadband amplifier 8, is a simple divider with a frequency dividing ratio of 1:2 or 1:4, i.e, one or two flip-flops, respectively, since this initial divider 63 must have a high frequency limit, e.g. 120 MHz for FM, and is thus rather expensive. For the subsequent divider stages 64 and 66 (depending on the frequency range) decimal dividers can be used where the input signals (rectangular oscillations) are fed, in a favorable manner, to the input of the first flip stage (e.g. a flip-flop) and are obtained at the output of the second stage. Thus the usually higher frequency limit of the first flip stage can simultaneoulsy be utilized in the decimal divider and a dividing the of 1:5 or 1:25 in divider 64 can be realized, so that resulting dividing ratios of, e.g., 1:10 or 1:100 are produced, the gate period again being divided in decades and being, for example, 10 ms. During AM operation, the switch 65 is positioned to cause the output signals from divider 63 to be fed directly to the divider 66 via path 67, i.e., without passing through divider 64, divider 66 also preferably containing the gate. During FM operation, however, the switch 65 is positioned so that path 67 is blocked and divider 64 is included in the division. The resulting dividing ratios for AM and FM operation are necessary if, for example, indication of the frequency during AM operation is desired to be given in five digits and in four digits for FM operation.

Figure 6:
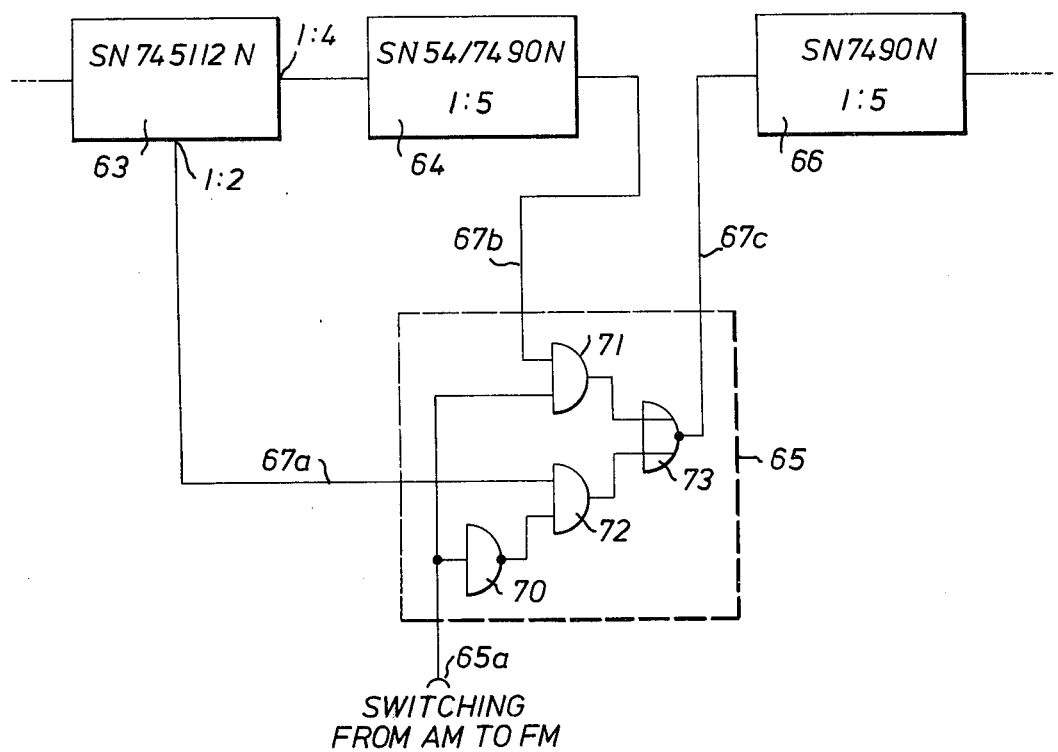
FIG. 6 is a more detailed circuit diagram of an embodiment corresponding to FIG. 5.

In FIG. 6 there is shown an embodiment corresponding to FIG. 5. The first divider 63 includes two flip-flops and therefore provides, at two output terminals a frequency dividing ratio of 1:2 or 11:4 respectively. The oscillations divided in the ratio of 1:2 are fed via the line 67a to the switch 65 and the oscillations divided in the ratio of 1:4 are fed to the divider 64. The first divider 63 is e.g. a SN 54S112N, while the divider 64 is a counter SN 54/7490N and the divider 66 is a counter SN 7490N (these types made by Texas Instruments).

Figure 7:
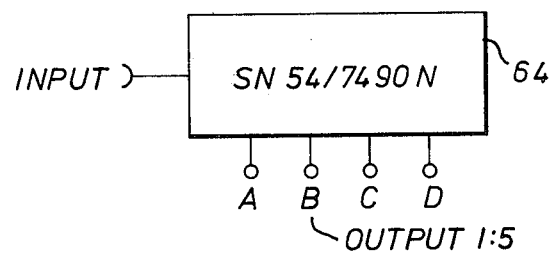
FIG. 7 is a more detailed block diagram of the divider 64 of FIG. 6.

FIG. 7 shows the divider 64 which has four output terminals A, B, C, D. The divider 64 includes four flip-flops. In accordance with the known truth table of the SN 54/7490N the signals on the output B, this is the output of the second flip stage of the divider 64, are divided in a ratio of 1:5.

The switch 65 includes two AND gates 71, 72, a NOR gate 73 and a NOT-element 70. The switch-over for AM or FM is made by logic signals 1 or 0 on the input 65a. For operating at AM, the input 65a is fed a 0 so that the AND gate 72 is opened. The oscillations divided 1:2 by the divider 63 now are fed via the line 67a, the AND gate 72, the NOR gate 73, and the line 67c to the divider 66. In this case the oscillations are divided in a ratio of 1:10. Because of the logic signal 0 on the input 65a, the AND gate 71 is not opened for oscillations on the line 67b.

For operating at FM, the input 65a is fed the logic signal 1. Now the AND gate 71 is opened. The oscillations divided 1:4 by the divider 63 and divided 1:5 by the divider 64 are fed via the line 67b, the AND gate 71, the NOR gate 73 and the line 67c to the divider 66. In this case the frequency dividing ratio is 1:100.

It will be understood that the above description of the present invention is susceptible to various modifications, changes and adaptations, and the same are intended to be comprehended within the meaning and range of equivalents of the appended claims.

1. In a circuit arrangement for digitally indicating the frequency to which a radio receiver having both an AM tuning oscillator and an FM tuning oscillator is tuned, said circuit arrangement including amplifying means, means for coupling the output signals from said AM and FM oscillator to the input of said amplifying means, means for converting the amplified output signals from said oscillators into rectangular signals, electronic counting means for counting the frequency of the rectangular signals and means responsive to the output signals from said counting means for providing a digital indication of the frequency to which the particular tuning oscillator is tuned, the improvement wherein said amplifying means comprises a common broadband amplifier having a bandwidth which is sufficiently broad so as to pass and amplify signal frequencies from both the AM and FM tuning oscillators; and wherein said coupling means comprises means for sufficiently loosely coupling the output signals of said AM tuning oscillator and of said FM tuning oscillator to the common input of said broadband amplifier so that said tuning oscillators are not noticeably detuned by changes in capacity in said broadband amplifier.

2. A circuit arrangement as defined in claim 1 wherein said means for loosely coupling the output signals of said AM tuning oscillator and of said FM tuning oscillator to said common input of said broadband amplifier comprises first and second capacitors each having one end connected to the output of a respective one of said tuning oscillators and its other end connected to a common connection point, and a common coaxial line connecting said common connection point to said input of said broadband amplifier.

3. A circuit arrangement as defined in claim 2 wherein said means for loosely coupling further includes a third capacitor connected between said common connecting point and ground.

4. A circuit arrangement as defined in claim 1, wherein said means for loosely coupling the output signals of said AM tuning oscillator and of said FM tuning oscillator does so in a low-ohmic manner and comprises first and second series connected inductances with each of said inductances being inductively coupled to one of said tuning oscillators, one end of said series connected inductances being connected with said common input of said common broadband amplifier, and the other end being connected to ground.

5. A circuit arrangement as defined in claim 1 wherein said means for converting includes means in said broadband amplifier for limiting the amplitude of the oscillations to transform same into rectangular oscillations.

6. A circuit arrangement as defined in claim 5 further including means for superimposing a direct current component on the rectangular output signals at the output of said broadband amplifier.

7. A circuit arrangement as defined in claim 1 wherein the operating voltage of said broadband amplifier simultaneously serves as the operating voltage for said electronic counter means.

8. A circuit arrangement as defined in claim 1 wherein said electronic counter means includes a frequency divider connected to the output of said broadband amplifier and having a plurality of dividing stages, wherein the first dividing stage of said frequency divider has a dividing ratio of 1:2 or 1:4 and wherein a second dividing stage with a dividing ratio of 1:5 or 1:25 is connected in series with said first dividing stage in order to produce a full decimal dividing ratio.

9. A circuit arrangement as defined in claim 8 wherein decimal dividers are used to produce said dividing ratio of 1:5 or 1:25, respectively, the oscillations being fed in at the input of the first flip stage and being obtained at the output of the second flip stage.

10. A circuit arrangement as defined in claim 8 wherein said frequency divider additionally includes a third dividing stage with a dividing ratio of 1:10, and a controllable switch means for connecting the input of said further dividing stage to either the output of said first dividing stage or the output of said second dividing stage.

* * * * *